(12) United States Patent
Chen

(10) Patent No.: US 9,171,915 B1
(45) Date of Patent: Oct. 27, 2015

(54) METHOD FOR FABRICATING SEMICONDUCTOR DEVICE

(71) Applicant: UNITED MICROELECTRONICS CORP., Hsin-Chu (TW)

(72) Inventor: Tzu-Ping Chen, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 49 days.

(21) Appl. No.: 14/277,784

(22) Filed: May 15, 2014

(51) Int. Cl.
  *H01L 21/336* (2006.01)
  *H01L 29/40* (2006.01)
  *H01L 21/28* (2006.01)

(52) U.S. Cl.
  CPC ........ *H01L 29/401* (2013.01); *H01L 21/28273* (2013.01); *H01L 21/28282* (2013.01)

(58) Field of Classification Search
  CPC ............... H01L 21/823456; H01L 21/823462; H01L 27/105; H01L 27/1052; H01L 27/11546; H01L 29/42324; H01L 27/11526; H01L 27/11529; H01L 27/11531; H01L 27/11541; H01L 27/11536
  See application file for complete search history.

(56) References Cited

U.S. PATENT DOCUMENTS

| 5,861,347 | A | 1/1999 | Maiti et al. | |
|---|---|---|---|---|
| 2002/0197800 | A1* | 12/2002 | Hashimoto | H01L 21/823462 438/266 |
| 2007/0210370 | A1* | 9/2007 | Lee | H01L 27/11521 257/315 |
| 2007/0228445 | A1* | 10/2007 | Jeong | H01L 27/115 257/314 |

* cited by examiner

*Primary Examiner* — Thanh Y Tran
(74) *Attorney, Agent, or Firm* — Winston Hsu; Scott Margo

(57) ABSTRACT

A method for fabricating semiconductor device is disclosed. The method includes the steps of first providing a substrate, in which the substrate includes a SONOS region and a EEPROM region. Next, a first gate layer is formed in the SONOS region and the EEPROM region, the first gate layer is patterned by removing the first gate layer from the SONOS region and forming a floating gate pattern in the EEPROM region, an ONO layer is formed in the SONOS region and the EEPROM region, a second gate layer is formed on the ONO layer of the SONOS region and the EEPROM region, the second gate layer and the first gate layer are patterned to form a floating gate and a control gate in the EEPROM region, and the second gate layer is patterned to form a first gate in the SONOS region.

12 Claims, 6 Drawing Sheets

US 9,171,915 B1

METHOD FOR FABRICATING SEMICONDUCTOR DEVICE

BACKGROUND OF THE INVENTION

1. Field of the Invention

The invention relates to a method for fabricating semiconductor device, and more particularly, to an integrated process for fabricating logic device, silicon-oxide-nitride-oxide-silicon (SONOS) cell, and electrically-erasable-programmable-read-only-memory (EEPROM) device.

2. Description of the Prior Art

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased electrically.

Product development efforts in memory device technology have focused on increasing the programming speed, lowering programming and reading voltages, increasing data retention time, reducing cell erasure times and reducing cell dimensions. Some of the flash memory arrays today utilize agate structure made of dual polysilicon layers (also refers to as the dual poly-Si gate). The polysilicon layer utilized in these gate structures often includes a dielectric material composed of an oxide-nitride-oxide (ONO) structure. When the device is operating, electrons are injected from the substrate into the bottom layer of the dual polysilicon layers for storing data. Since these dual gate arrays typically store only one single bit of data, they are inefficient for increasing the capacity of the memory. As a result, a flash memory made of silicon-oxide-nitride-oxide-silicon (SONOS) is derived. Preferably, a transistor from these memories is capable of storing two bits of data simultaneously, which not only reduces the size of the device but also increases the capacity of the memory significantly.

Despite the common utilization of these devices, EEPROM devices and SONOS memories are often fabricated by distinct processes individually. Hence, how to effectively integrate the fabrication of these two devices with the incorporation of other devices such as logic or high-voltage devices without adding extra steps has become an important study in this field.

SUMMARY OF THE INVENTION

It is therefore an objective of the present invention to provide an integrated process for fabricating SONOS memory, EEPROM device, and preferably logic device altogether.

According to a preferred embodiment of the present invention, a method for fabricating semiconductor device is disclosed. The method includes the steps of first providing a substrate, in which the substrate includes a SONOS region and a EEPROM region. Next, a first gate layer is formed over the SONOS region and the EEPROM region, the first gate layer is patterned by removing the first gate layer from the SONOS region and forming a floating gate pattern in the EEPROM region, an ONO layer is formed over the SONOS region and the EEPROM region, a second gate layer is formed on the ONO layer of the SONOS region and the EEPROM region, the second gate layer and the first gate layer are patterned to form a floating gate and a control gate in the EEPROM region, and the second gate layer is patterned to form a first gate in the SONOS region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
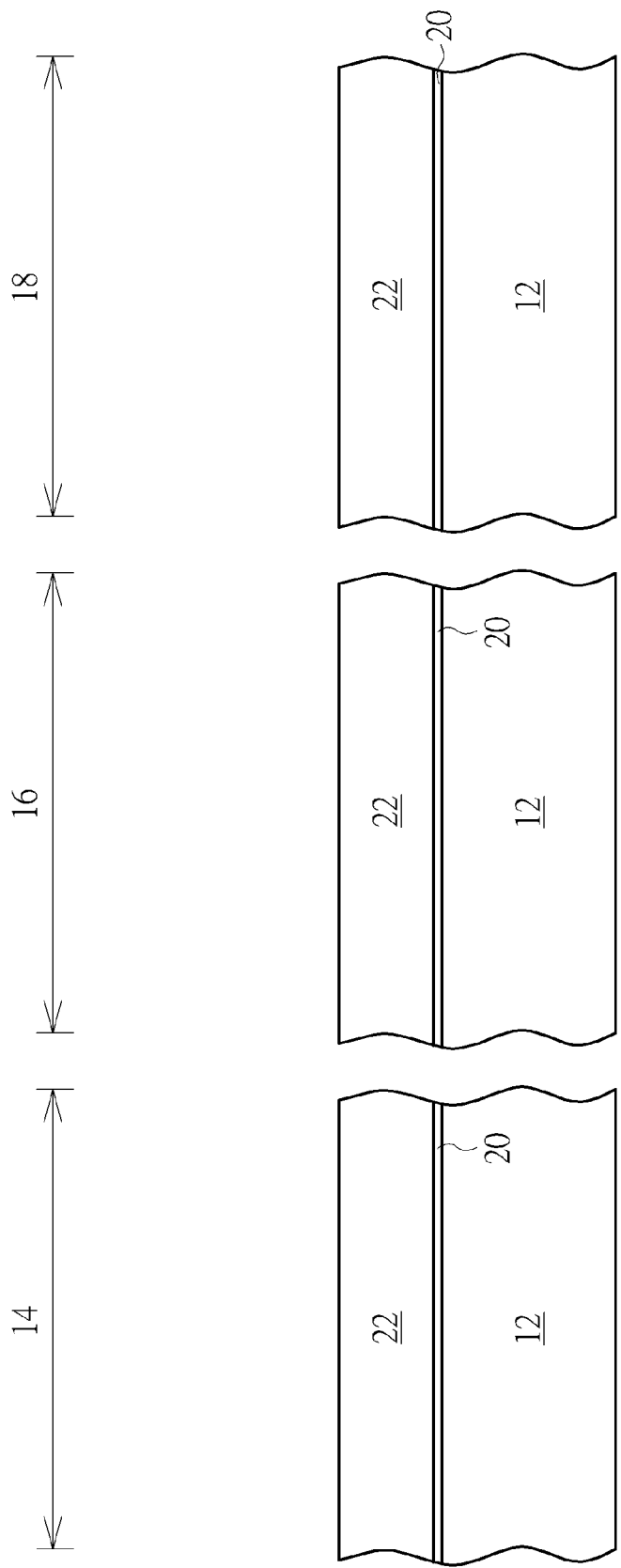
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. As shown in FIG. 1, a substrate 12, such as a semiconductor substrate composed of gallium arsenide (GaAs), silicon on insulator (SOI) layer, epitaxial layer, silicon germanium layer, or other semiconductor materials is provided.

Preferably, a logic region 14, a SONOS region 16, and an EEPROM region 18 are defined on the substrate 12, in which the regions are utilized for fabricating a logic device or high-voltage device, a SONOS memory, and an EEPROM device thereafter. Next, a gate dielectric layer 20 with a thickness of approximately 80 Angstroms is formed over the logic region 14, the SONOS region 16, and the EEPROM region 18, and a first gate layer 22 with a thickness of approximately 1600 Angstroms is formed on the gate dielectric layer 20 of the logic region 14, the SONOS region 16, and the EEPROM region 18. The gate dielectric layer 20 is preferably composed of silicon dioxide, and the first gate layer is preferably composed of polysilicon, but not limited thereto.

Figure 2:
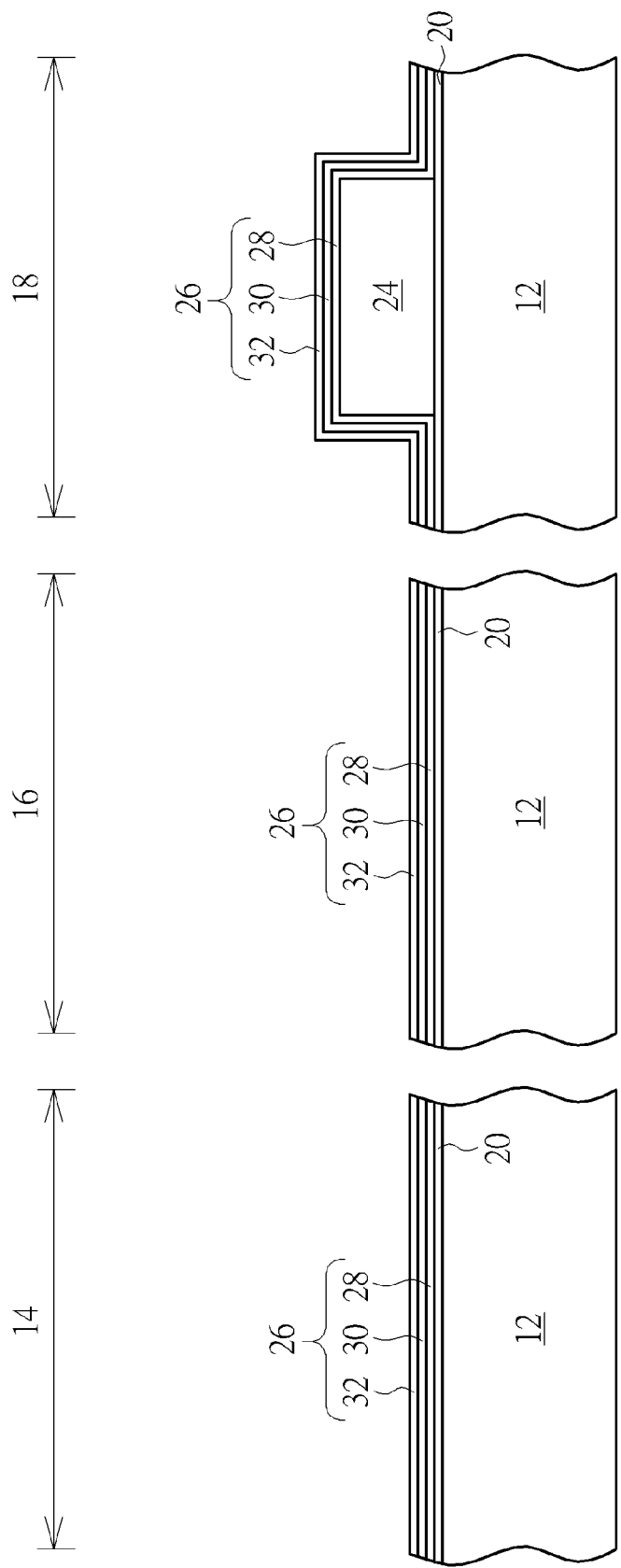

Next, as shown in FIG. 2, a patterning process is conducted by first forming a patterned resist (not shown) on the first gate layer 22 of the EEPROM region 18, and an etching process is carried out by using the patterned resist as mask to partially remove the first gate layer 22 from the EEPROM region 18 while totally removing the first gate layer 22 from the logic region 14 and the SONOS region 16. This forms a floating gate pattern 24 in the EEPROM region 18.

It should be noted that even though part of the first gate layer in the EEPROM region 18 is etched in this embodiment, the aforementioned patterned resist could also be formed to cover the entire EEPROM region 18 while the first gate layer 22 in the logic region 14 and the SONOS region 16 is removed completely so that none of the first gate layer 22 in the EEPROM region 18 is removed, which is also within the scope of the present invention.

An ONO layer 26 with a thickness of approximately 140 Angstroms is then deposited over the logic region 14, the SONOS region 16, and the EEPROM region 18, in which the ONO layer 26 is preferably composed of a bottom oxide layer 28, a nitride layer 30, and a top oxide layer 32. According to a preferred embodiment of the present invention, both the bottom oxide layer 28 and the top oxide layer 32 are formed by a high temperature oxide (HTO) process while the nitride layer 30 therebetween is formed by a thermal process.

As first gate layer 22 is removed from both the logic region 14 and the SONOS region 16, the ONO layer 26 in the logic region 14 and the SONOS region 16 is preferably deposited directly on the gate dielectric layer 20 while the ONO layer 26 in the EEPROM region 18 is deposited on the top surface of the floating gate pattern 24 as well as the sidewall of the floating gate pattern 24.

Figure 3:
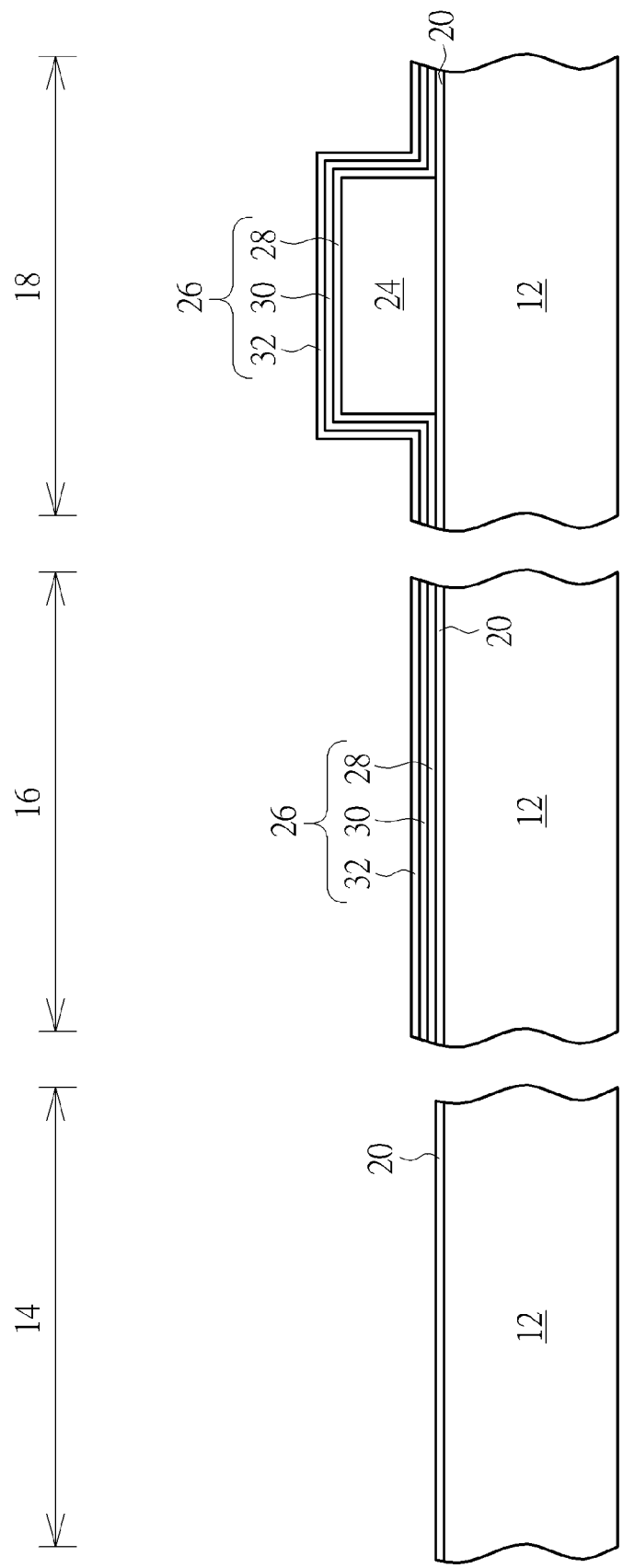

As shown in FIG. 3, an etching process is then conducted to remove the ONO layer 26 from the logic region 14. The removal of the ONO layer 26 from the logic region 14 may be accomplished by first forming a patterned mask, such as a patterned resist over the SONOS region 16 and the EEPROM region 18, and an etching process is conducted by using the patterned resist as mask to remove the ONO layer 26 from the logic region 14. According to an embodiment of the present invention, the gate dielectric layer 20 in the logic region 14 can be fully or partially removed by the same etching process used for removing the ONO layer 26 from the logic region 14, which is also within the scope of the present invention.

It should be noted that even though none of the ONO layer 26 is removed from the SONOS region 16 as ONO layer 26 is removed from the logic region 14, the aforementioned patterned resist could also be formed to cover the EEPROM region 18 and part of the SONOS region 16 and an etching process could be conducted by using the patterned resist as mask to remove the entire ONO layer 26 from the logic region 14 and part of the ONO layer 26 from the SONOS region 16, which is also within the scope of the present invention.

Figure 4:
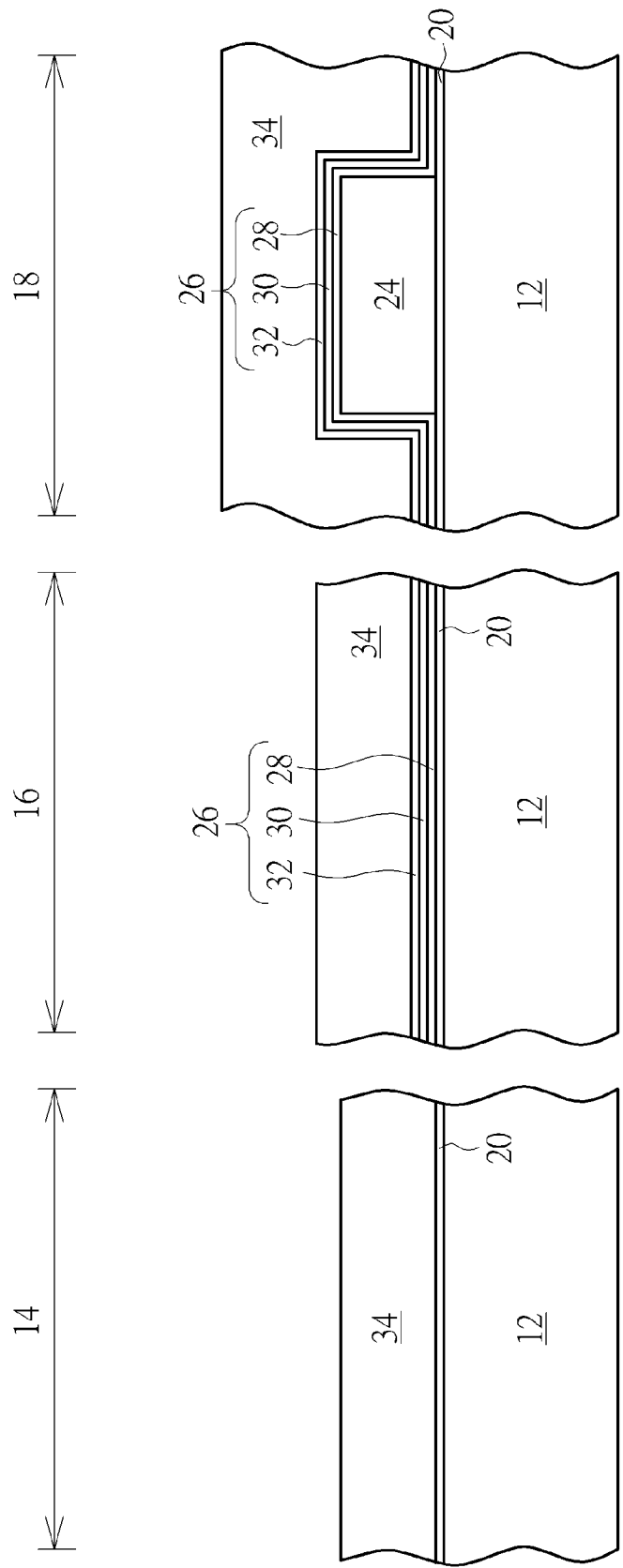

Next, as shown in FIG. 4, a second gate layer 34 composed of polysilicon is deposited over the logic region 14, the SONOS region 16, and the EEPROM region 18. As no ONO layer 26 is present in the logic region 14, the second gate layer 34 is preferably formed directly on the gate dielectric layer 20 of logic region 14 while depositing on the ONO layer 26 of the SONOS region 16 and the EEPROM region 18. It should be noted that if the gate dielectric layer 20 were removed along with the ONO layer 26 from the logic region 14 as addressed previously, another gate dielectric layer could be re-grown in the logic region 14 before the second gate layer 34 is formed, which is also within the scope of the present invention.

Figure 5:
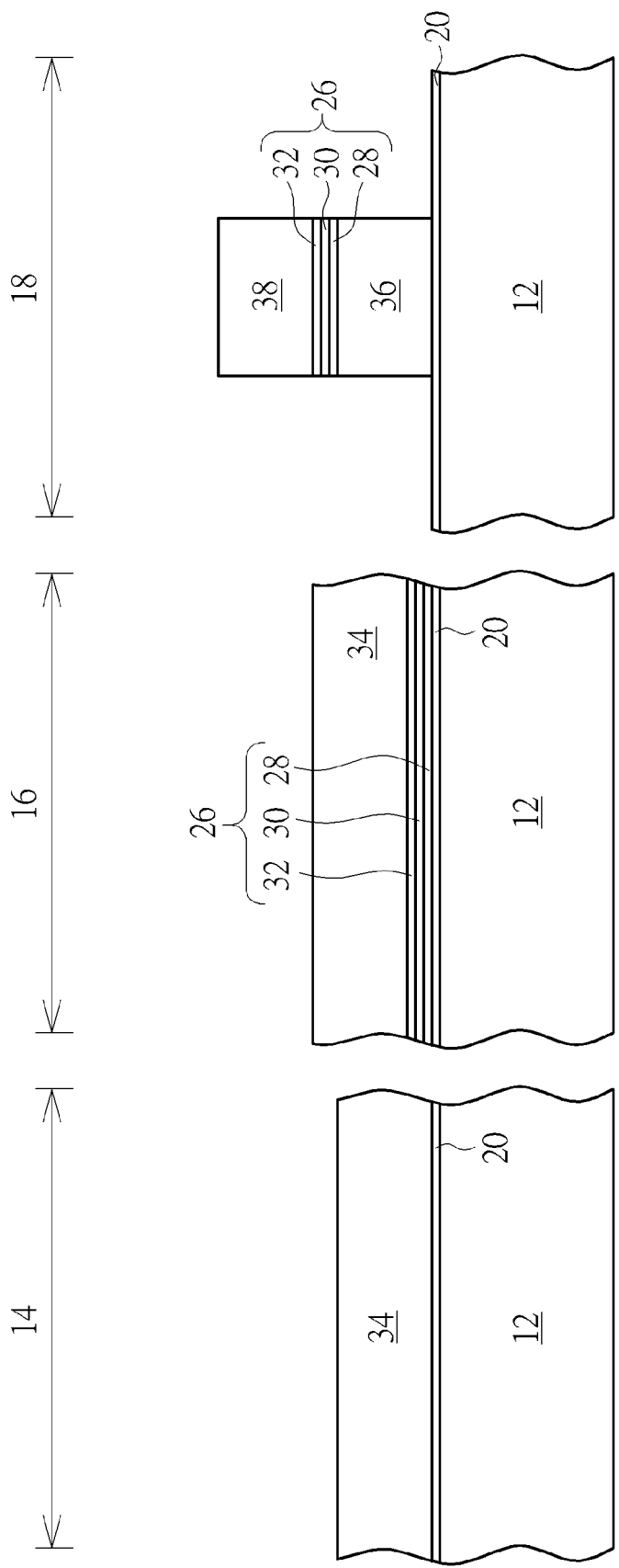

Next, as shown in FIG. 5, a patterning process is conducted on the second gate layer 34 and the floating gate pattern 24 of the EEPROM region 18 to form a control gate and a floating gate. The patterning process is preferably accomplished by first forming a patterned mask, such as a patterned resist (not shown) over the logic region 14, the SONOS region 16, and part of the EEPROM region 18, and an etching process is conducted to partially remove the second gate layer 34, the ONO layer 26, and the floating gate pattern 24 not covered by the patterned resist in the EEPROM region 18. It should be noted the ONO layer 26 formed on the sidewall of the floating gate pattern 24 is preferably removed in the etching process. This forms a floating gate 36 and a control gate 38 in the EEPROM region 18.

Figure 6:
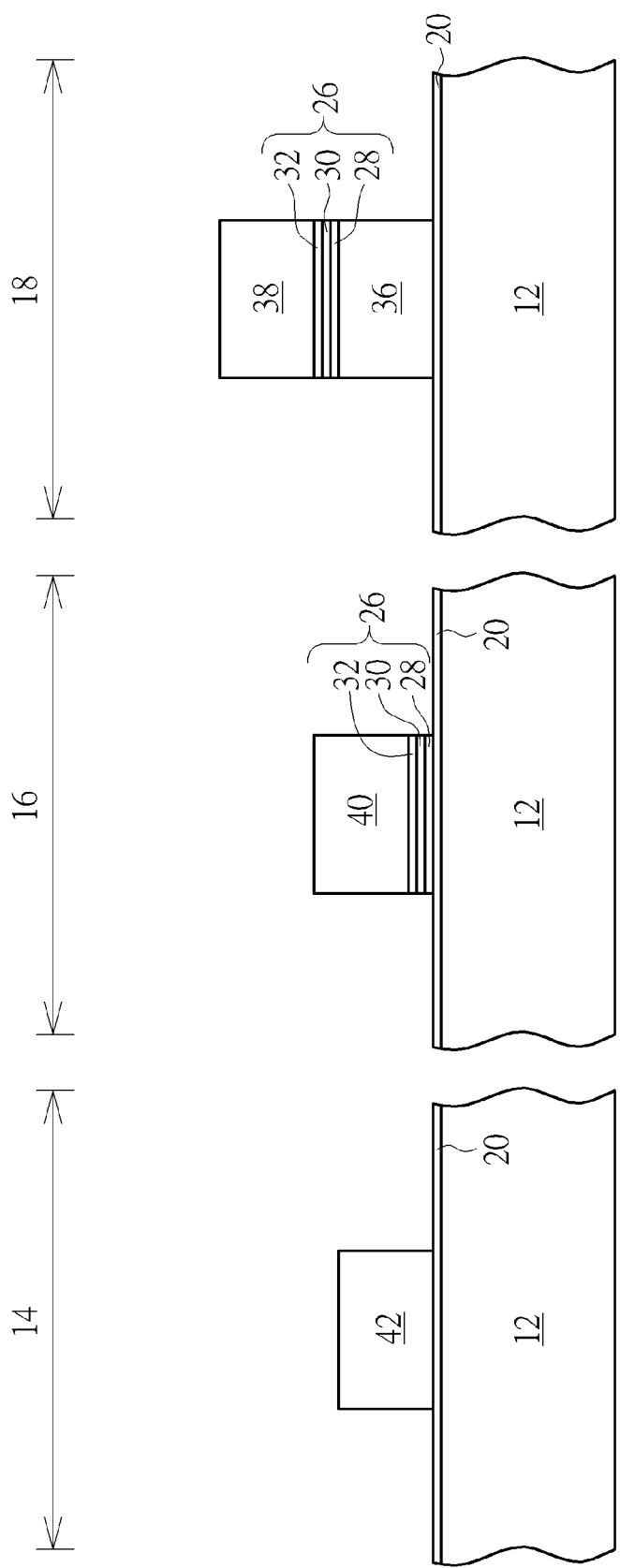

Next, as shown in FIG. 6, another patterning process is conducted on the second gate layer 34 of the logic region 14 and the SONOS region 16 to form a first gate and a second gate. Similar to the patterning process carried out in FIG. 5, the patterning process could be accomplished by first forming a patterned mask, such as a patterned resist (not shown) over the EEPROM region 18, part of the logic region 14 and part of the SONOS region 16, and an etching process is conducted to partially remove the second gate layer 34 and ONO layer 26 not covered by the patterned resist in the logic region 14 and SONOS region 16. This forms a first gate 40 in the SONOS region 16 and a second gate 42 in the logic region 14.

After the aforementioned gate structures including floating gate 36 and control gate 38 in the EEPROM region 18, the first gate 40 in the SONOS region 16, and second gate 42 in the logic region 14 are fabricated, elements such as spacers and source/drain regions could be formed thereafter in each region according to the demand of the product. As the fabrication of these processes is well known to those skilled in the art, the details of which are not explained herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate, wherein the substrate comprises a SONOS region and a EEPROM region;
   forming a first gate layer over the SONOS region and the EEPROM region;
   patterning the first gate layer by removing the first gate layer from the SONOS region and forming a floating gate pattern in the EEPROM region;
   forming an ONO layer over the SONOS region and the EEPROM region;
   forming a second gate layer on the ONO layer of the SONOS region and the EEPROM region;
   patterning the second gate layer and the first gate layer to form a floating gate and a control gate in the EEPROM region; and
   patterning the second gate layer to form a first gate in the SONOS region.

2. The method of claim 1, wherein the substrate further comprises a logic region, the method further comprising:
   forming the first gate layer over the logic region, the SONO region, and the EEPPROM region;
   patterning the first gate layer by removing the first gate layer from the logic region and the SONOS region and forming the floating gate pattern in the EEPROM region;
   forming the ONO layer over the logic region, the SONOS region, and the EEPROM region;
   removing the ONO layer from the logic region and partially etching the ONO layer of the SONOS region;
   forming the second gate layer over the logic region and the ONO layer of the SONOS region and the EEPROM region;
   patterning the second gate layer and the first gate layer to form the floating gate and the control gate in the EEPROM region; and
   patterning the second gate layer to form the first gate in the SONOS region and a second gate in the logic region.

3. The method of claim 2, further comprising forming a gate dielectric layer over the logic region, the SONOS region, and the EEPROM region before forming the first gate layer.

4. The method of claim 3, further comprising partially removing or completely removing the gate dielectric layer from the logic region after removing the ONO layer from the logic region.

5. The method of claim 3, further comprising forming another gate dielectric layer over the logic region before forming the second gate layer.

6. The method of claim 3, wherein the gate dielectric layer comprises silicon dioxide.

7. The method of claim 1, wherein the first gate layer comprises polysilicon.

8. The method of claim 1, wherein the second gate layer comprises polysilicon.

9. The method of claim 1, wherein the ONO layer comprises a bottom oxide layer, a nitride layer and a top oxide layer.

10. The method of claim 9, wherein the bottom oxide layer is formed by a high temperature oxide (HTO) process.

11. The method of claim 9, wherein the nitride layer is formed by a thermal process.

12. The method of claim 9, wherein the top oxide layer is formed by a high temperature oxide (HTO) process.

* * * * *